United States Patent
Trotta

(10) Patent No.: US 7,602,221 B2
(45) Date of Patent: Oct. 13, 2009

(54) DYNAMIC FREQUENCY DIVIDER

(75) Inventor: Saverio Trotta, Munich (DE)

(73) Assignee: Infineon Technologies AG, Neubiberg (DE)

(*) Notice: Subject to any disclaimer, the term of this patent is extended or adjusted under 35 U.S.C. 154(b) by 123 days.

(21) Appl. No.: 11/741,007

(22) Filed: Apr. 27, 2007

(65) Prior Publication Data

US 2007/0279108 A1    Dec. 6, 2007

(30) Foreign Application Priority Data

May 30, 2006    (EP)    ................... 06011120

(51) Int. Cl.
*H03B 19/00* (2006.01)
(52) U.S. Cl. ....................... 327/117; 327/115
(58) Field of Classification Search ............. 327/115, 327/117
See application file for complete search history.

(56) References Cited

U.S. PATENT DOCUMENTS

| 3,605,023 | A | | 9/1971 | Kline, Jr. |
| 4,695,940 | A | * | 9/1987 | Rein ........................... 363/157 |
| 5,359,241 | A | * | 10/1994 | Hasegawa et al. ........... 326/126 |
| 5,815,019 | A | * | 9/1998 | Uemura et al. .............. 327/202 |
| 6,144,846 | A | | 11/2000 | Durec |
| 2004/0012408 | A1 | * | 1/2004 | Yepp ........................... 326/63 |

* cited by examiner

*Primary Examiner*—Lincoln Donovan
*Assistant Examiner*—Ryan C Jager
(74) *Attorney, Agent, or Firm*—Dicke, Billig & Czaja, PLLC

(57) ABSTRACT

A dynamic frequency divider is proposed in which a double mixer is used for the dynamic frequency division. In one example the division is by N, where N≧2 and a positive integer. The dynamic frequency divider further includes an input stage with level shift means, a filter filtering the output signal and providing a feedback signal to the double mixer. In one case, using just one double mixer significantly reduces the power consumption of a dynamic frequency divider and utilizes considerably less space, making it simpler, cheaper and smaller.

17 Claims, 5 Drawing Sheets

DYNAMIC FREQUENCY DIVIDER

CROSS-REFERENCE TO RELATED APPLICATIONS

This Utility Patent Application claims priority to European Patent Application No. 06011120.0-2215 filed on May 30, 2006, which is incorporated herein by reference.

BACKGROUND

The present invention generally relates to the field of frequency division, such as used for signals in the GHz range, and more specifically, to an apparatus and method for a dynamic frequency division by four.

For various applications in electronics, there is a need for frequency dividers at very high frequencies up to several 10 GHz. Furthermore, frequency dividers are used in a wide variety of important high-speed and radio-frequency (RF) integrated circuits, such as in phase-locked loops (PLLs) and other telecommunication devices. However, conventional static frequency dividers are not suitable for high operating frequencies and instead so called dynamic frequency dividers are employed for this purpose.

Originally proposed by Miller in 1939, the dynamic frequency divider is based on mixing the output signal of the mixer with the input signal and applying the result to a low-pass filter (LPF), as illustrated in FIG. 1. Under proper phase and gain conditions, the component at $\omega_{in}/2$ "survives" and circulates around a loop. Since the device capacitances are absorbed in the low pass filter, this topology achieves a high speed.

The example illustrated in FIG. 1 illustrates that an input signal X(t) with a frequency $\omega$ is mixed by a mixer 1 to the two sideband frequencies $\omega_{in}/2$ and $\omega_{in} 3/2$. The frequency $\omega_{in} 3/2$ is then filtered out by a low-pass filter 2 leaving only the signal with $\omega_{in}/2$ to be looped back to the mixer eventually producing an output signal y(t), which is the input signal X(t) divided by two.

Mixers used for frequency conversion are critical components in dynamic frequency division. A mixer converts, for example, RF signals of one frequency into signals of another frequency to make signal processing easier and also inexpensive. Another fundamental reason for frequency conversion is to enable amplification of the received signal at a frequency other than, for example, the RF or audio frequency.

An ideal mixer is a device that multiplies two signals producing an output signal with a new frequency spectrum. Hence, the mixer essentially shifts the frequency spectrum of the input signal using a signal of higher or lower frequency into a new signal with two frequency components that are the sum and difference of the two signals frequencies.

An operation converting a high frequency signal into a low frequency signal is called down conversion and an operation converting a low frequency signal into a high frequency signal is called up conversion.

A regenerative frequency divider by N ($N \geq 2$), based on special loop-filter, was proposed by Miller in R. L. Miller, "Fractional frequency generators utilizing regenerative modulation" Proc. I.R.E., pp 446-457, 1939, although, the regenerative dividers subsequently designed and studied have been exclusively divide-by-two configurations.

Frequency dividers with greater division ratios have been described, for example, in J. F. Garcia Nava, A. Hati, C. W. Nelson, A. Sen Gupta, F. L. Walls and T. N. Tasset, "Parallel configuration for conjugate regenerative dividers", IEEE Int. Freq. Control Symposium and PDA Exhibition, 2003, A. S. Gupta, J. F. Garcia Nava and F. L. Walls, "A noval low noise regenerative divide-by-four circuit", IEEE Int. Freq. Control Symposium and PDA Exhibition, 2002, and A. S. Gupta, F. F. Garcia Nava, and F. L. Walls, "Conjugate regenerative dividers", IEEE Trans. on Ultrasonic, Ferroelectric, and Frequency control, Vol. 51, No. 3, March 2004.

However, in order to obtain frequency divisions higher than two, frequency dividers have to be either cascaded or complicated filter systems have to be included into the transfer function of the feedback loop. Also, the power consumption is relatively high and the circuitry utilizes a considerable amount of space due to the increased number of electric components needed, making conventional dynamic frequency dividers complex and expensive.

A regenerative divider with a division raisure of N, where N is greater than two, based on multiple mixing of an input signal with a sample of the output signal is described in U.S. Pat. No. 3,605,023. The divider described therein incorporates two mixers, as well as low-pass filter means within the mixters.

U.S. Pat. No. 6,144,846 describes an example of a double-mixer, within a frequency translation circuit translating an incoming reference signal to a lower frequency.

SUMMARY

An integrated circuit includes a level shift, a double mixer, a filter, and a buffer. The level shift has first and second inputs and first and second outputs. The first input of the level shift is coupled to an input signal. The double mixer has first, second and third inputs and an output. The first input of the double mixer is coupled to the first output of the level shift and the second input of the double mixer is coupled to the second output of the level shift. The filter has first and second inputs and first and second outputs. The output of the double mixer is coupled to the first input of the filter, and the first output of the filter is looped back to the third input of the double mixer. The buffer has an input and an output, and the buffer is operable to buffer and output at least an output signal. The input of the buffer is coupled to the second output of the filter.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
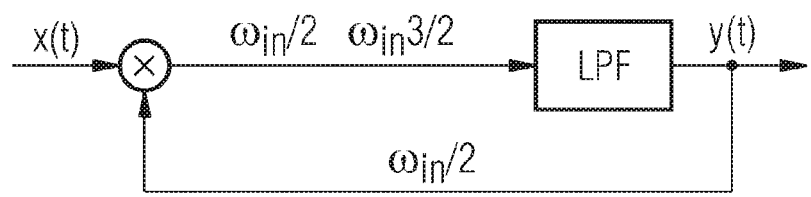
FIG. 1 illustrates schematically a conventional dynamic frequency divider.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is an embodiment of the present invention to provide a dynamic frequency divider by N and a method of dynamic frequency division by N, where N is $\geq 2$ and a positive integer, and more specifically a dynamic frequency divider by four and a method of dynamic frequency division by four, operable at very high frequencies and without showing any of the disadvantages mentioned above.

In one example, the embodiments of the present invention are attained by a dynamic frequency divider by N, where N$\geq$2 and a positive integer, including a first divider input operable to receive a first input signal, level shift means including a first level-shift input and a plurality of level-shift outputs, wherein said first level-shift input is coupled to said first divider input, a double mixer including a first and second double-mixer input and a first double-mixer output, wherein said first double-mixer input is coupled to a first level-shift output and wherein said second double-mixer input is coupled to a second level-shift output, filter means including a first filter input and a plurality of filter outputs, wherein said first double-mixer output is coupled to said first filter input, and wherein a first filter output is looped back to a third double-mixer input, and buffer means including a first buffer input and a first buffer output, operable to buffer and output at least a first output signal, wherein said first buffer input is also coupled to a second filter output.

Furthermore, embodiments of the present invention are also attained by a communication device including at least one radio-frequency integrated circuit including at least one dynamic frequency divider according to the present invention.

One aspect of the present invention is that a double mixer is used for a dynamic frequency divider by N, where N$\geq$2 and a positive integer, instead of a plurality of cascaded mixers and/or complex filters that are used within the feedback loop of a conventional dynamic frequency divider. Therefore, the power consumption of the dynamic frequency divider of the present invention is reduced significantly and utilizes considerably less space, making it simpler, cheaper and smaller.

In one embodiment of the present invention, said level shift means include a plurality of cascaded emitter followers that are used to shift down at least a first input signal to a first and second shift signal driving the first and second double-mixer input, respectively.

In another embodiment of the present invention, said level shift means include a plurality of diodes arranged in such a way that said first input signal is shifted down to a first and second shift signal driving said first and second double-mixer input, respectively. The use of diodes allows a further reduction of the power consumption.

Furthermore, said filter means is tuneable to a predetermined frequency range by an adjustable reference voltage of said filter. This allows the properties of the filter to be changed according to a desired cut-off frequency further improving the quality of the filtered output signal.

In addition, the dynamic frequency divider of one embodiment of the present invention further includes a second input operable to receive a second input signal. This allows a further improvement of the quality of said output signal by reducing occurring harmonics of said input signal when mixed.

The topology that is presented in this invention is based on a double mixer 20. The filtered output signal from the double mixer 20 is mixed with an input signal Clk. The signal which comes out from the first "mixing stage" is mixed again with the input signal Clk. Therefore, the divide ratio of the regenerative divider is four. The double mixer includes two stacked Gilbert cells.

Figure 2:
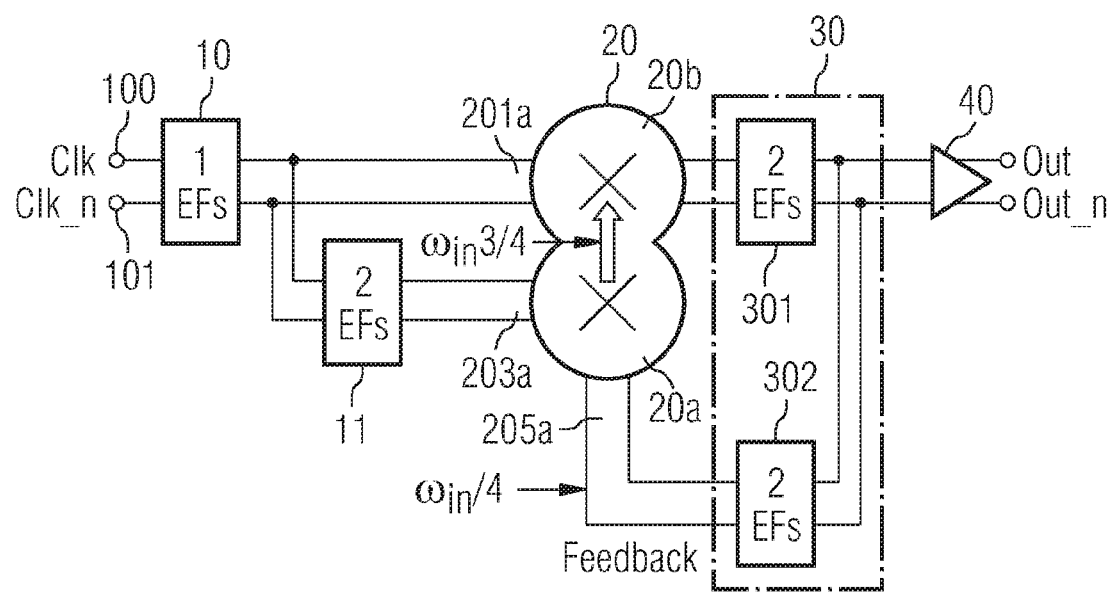
FIG. 2 illustrates schematically a simplified diagram of an embodiment of the present invention.
Figure 3:
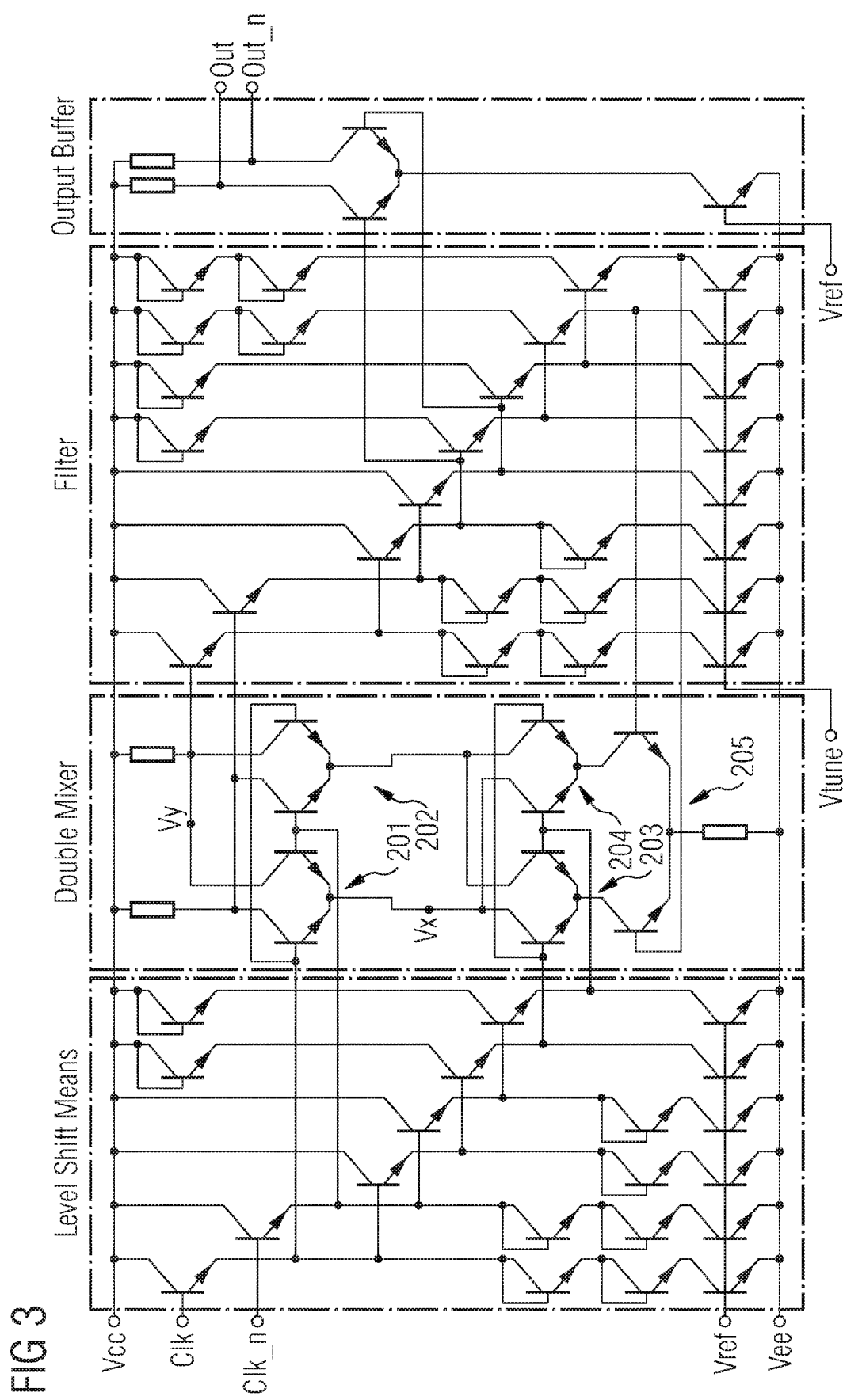
FIG. 3 illustrates schematically a detailed circuit diagram of an embodiment of the present invention.

FIG. 2 illustrates a simplified diagram of a dynamic frequency divider by four including level shift blocks 10 and 11, a double-mixer 20 including a 'Gilbert-cell' 20a, a low-pass filter 30 and an output buffer 40. The additional mixing stage of the double mixer 20 includes the upper differential pairs 201 and 202. Here, an input signal Clk and an inverted input signal Clk_n are received by a first 100 and second input 101 of said level shift block 10, where the signals Clk and Clk_n are shifted down by a first emitter follower 10, respectively, producing a first shift signal for each input signal Clk and Clk_n, respectively fed into a first double-mixer input 201a. The detailed circuitry diagram in FIG. 3 illustrates that the upper differential pairs 201 and 202 of the double mixer 20 are driven by the same first shift signal of respective input signals Clk and Clk_n.

After said first emitter followers 10, said signals Clk and Clk_n are shifted down in parallel by two more emitter followers 11 producing a second shift signal for each of the input signals Clk and Clk_n that are fed into a second double-mixer input 203a. The detailed circuitry diagram in FIG. 3 illustrates that the lower differential pairs 203 and 204 of the double mixer 20 are driven by the same second shift signal of respective input signals Clk and Clk_n.

Occurring disturbing harmonics generated by the double-mixer 20 are filtered out by a low-pass filter 30 that consists of two emitter follower pairs 301 and 302, and is coupled to the output of said double-mixer 20. The current sources of the emitter follower pairs 301 and 302 are adjusted by a voltage $V_{tune}$ (FIG. 3) allowing the current density of the transistors in the emitter followers 301 and 302 to be changed in such a way that the filter 30 is tuned to a predetermined cut-off frequency.

The filter 30 further provides a feedback signal that is looped back to the third double-mixer input 205a, where it is mixed two times with the high frequency input signals Clk and Clk_n, providing respective output signals Out and Out_n corresponding to the input signals Clk and Clk_n divided by four. The output signals Out and Out_n are also buffered by the Buffer 40 allowing only one signal to be released at a time.

The following simple numerical example illustrates that with an input signal Clk of a frequency $\omega_{in}$ and an output signal Out of a frequency $\omega_{in}/4$, the input signal Clk with $\omega_{in}$ is mixed at a first stage 20a of the double mixer 20 into an intermediate signal of a frequency $\omega_{in}3/4$ and $\omega_{in}5/4$. The intermediate signal with the frequency $\omega_{in}3/4$ is then fed into a second stage 20b of the double mixer 20 producing signals with frequencies of $\omega_{in}/4$ and $\omega_{in}7/4$. The signal with $\omega_{in}7/4$ is filtered out by the following low-pass filter 30 resulting in an output signal with only a frequency of $\omega_{in}/4$, which is fed back into the 'Gilbert Cell' 20a of the double mixer 20 via said third double mixer input 205a.

For example, with an input signal Clk of 160 GHz, the output signal from the double mixer, under proper phase and gain conditions, will be 40 GHz. The signal is then filtered and applied to the differential pair 203 and 204 of the stacked double mixer 20. The intermediate signal after the first mixing with the input signal at 160 GHz illustrates a frequency of 120 GHz, which is $\omega_{in}3/4$. This signal is then mixed again with the input signal Clk at 160 GHz, where the output will be 40 GHz, which is $\omega_{in}/4$.

Figure 4:
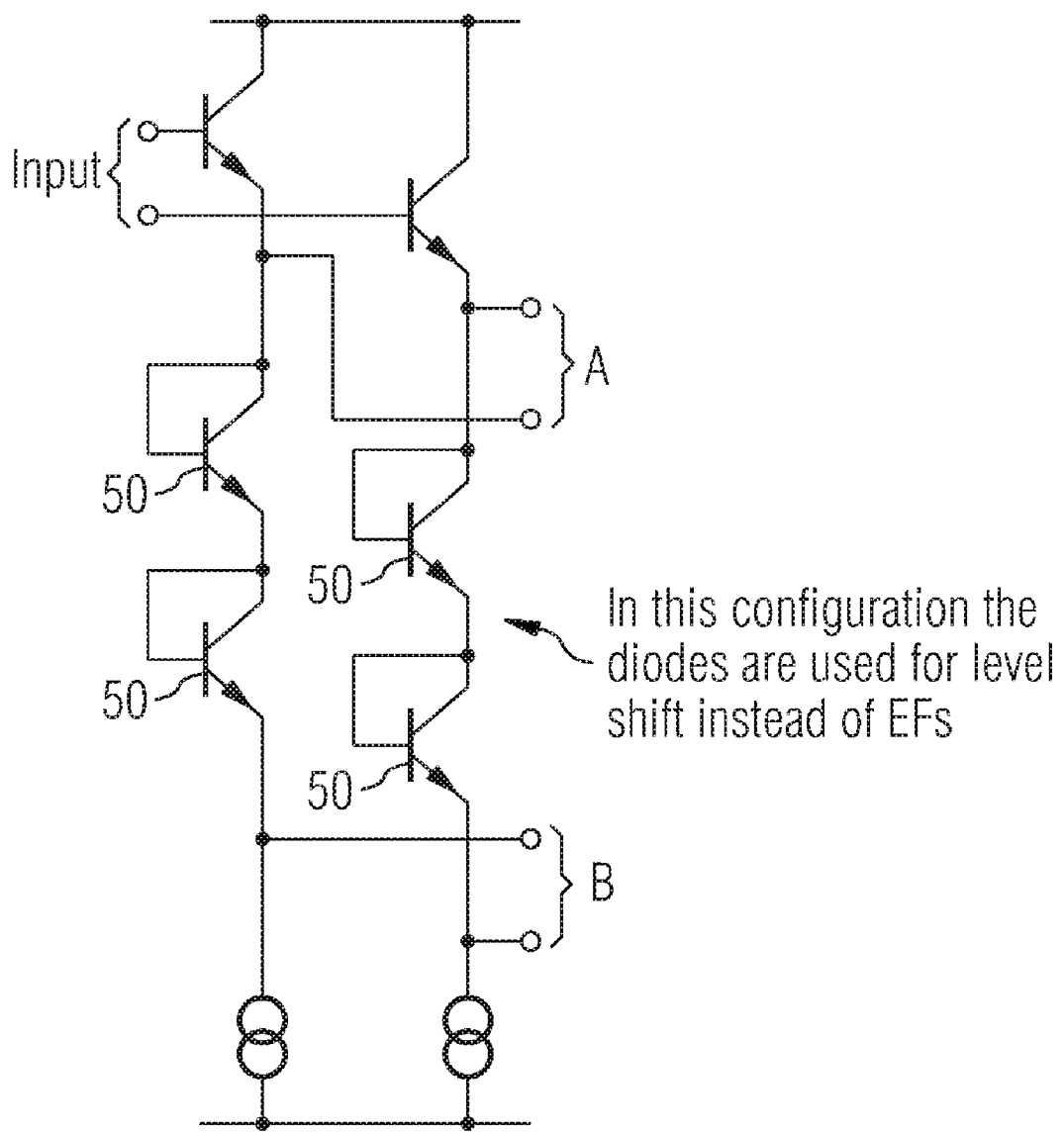
FIG. 4 illustrates schematically a configuration for level shift means using diodes instead of emitter followers.

In order to reduce the current used in the input stage, diodes instead of emitter followers can be used to shift down the input signal producing a shift signal driving the double mixer. An example of the input stage including level shift blocks with diodes is illustrated in FIG. 4.

Figure 5:
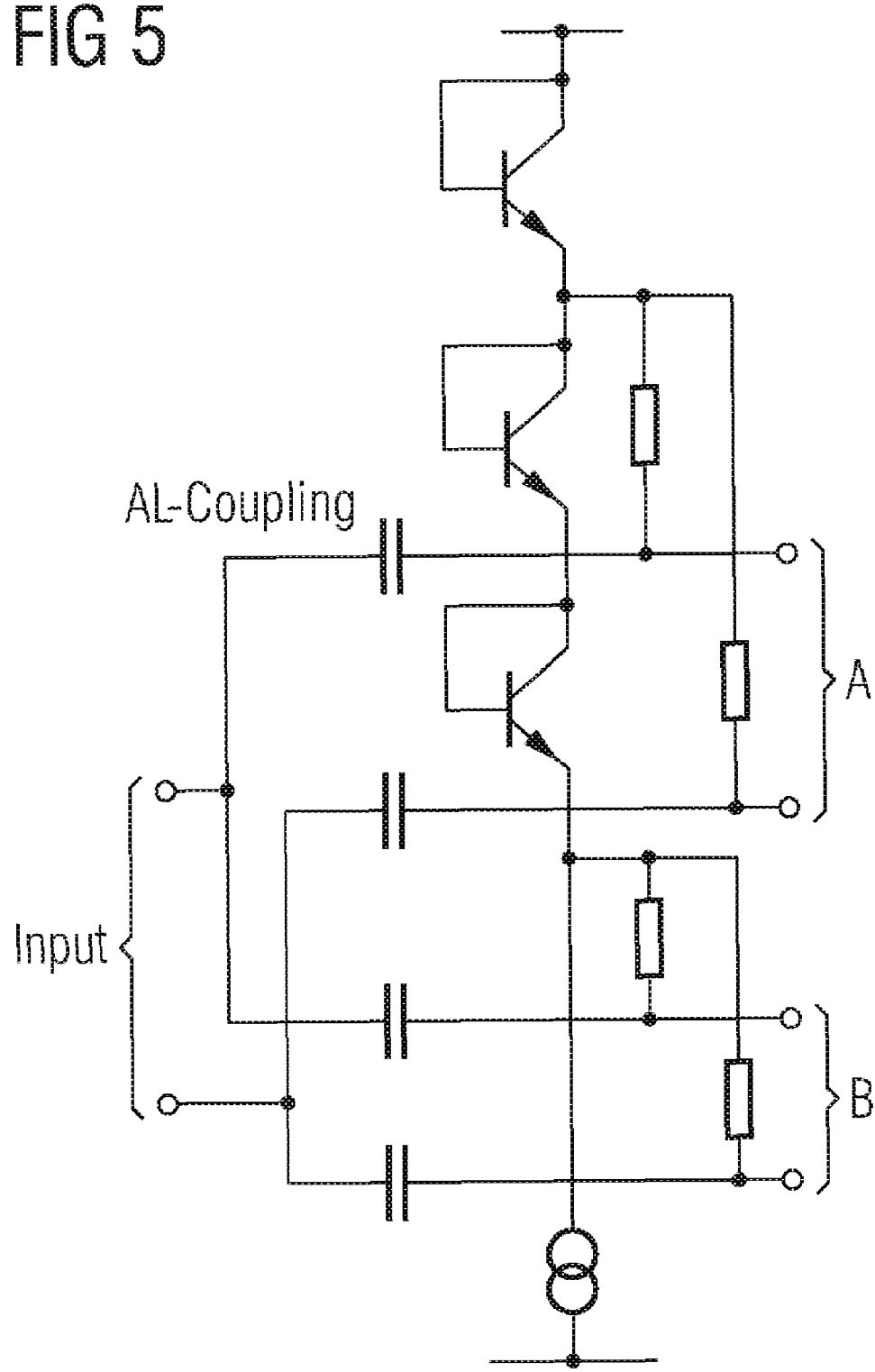
FIG. 5 illustrates schematically another embodiment of the input stage of the present invention in order to generate different DC levels.

Another example of an alternative input stage for the dynamic frequency divider is illustrated in FIG. 5, where a configuration is used to generate different DC levels compared with the configuration of the embodiment.

Figure 6:
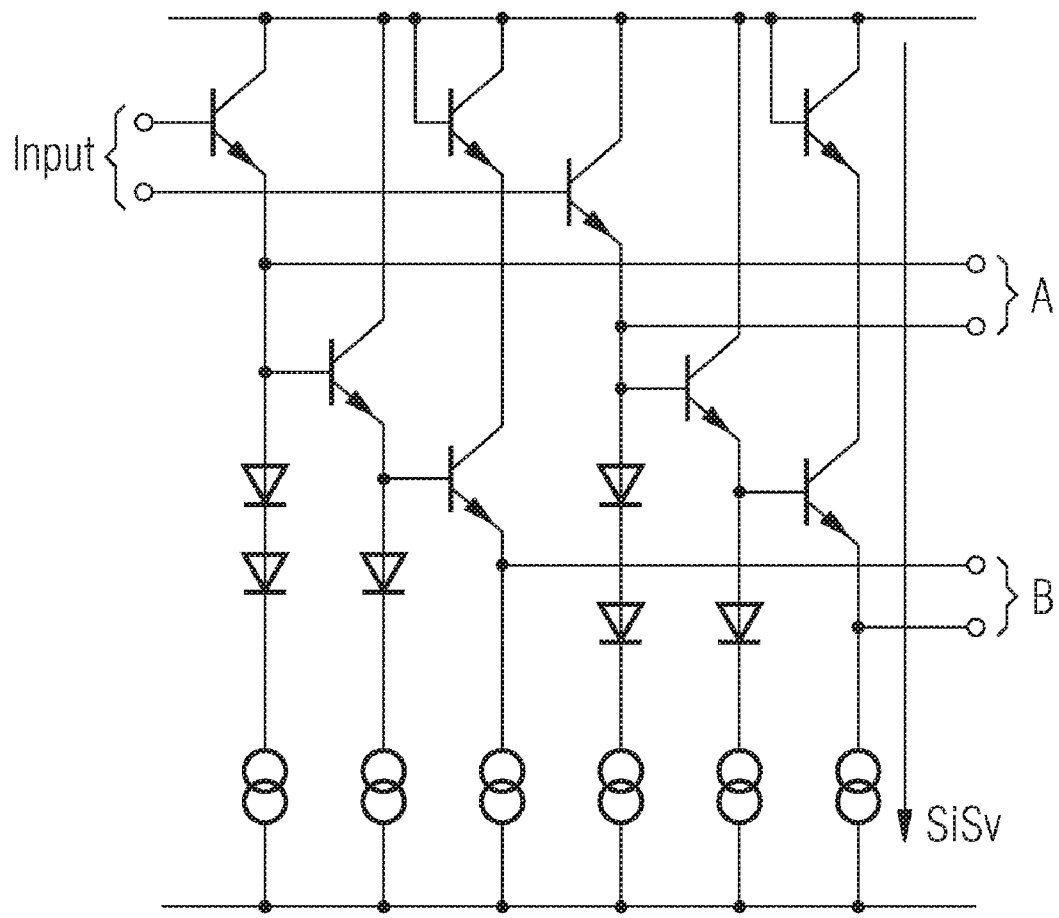
FIG. 6 illustrates schematically another embodiment of the input stage of the present invention including an alternative configuration.

Furthermore, FIG. 6 illustrates yet another configuration to apply the input signals Clk and Clk_n to the first and second input of the double mixer 20.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a level shift having first and second inputs and first and second outputs, wherein the first input of the level shift is coupled to an input signal;
   a double mixer having first, second and third inputs and an output, wherein the first input of the double mixer is coupled to the first output of the level shift and wherein the second input of the double mixer is coupled to the second output of the level shift;
   a filter having first and second inputs and first and second outputs, wherein the output of the double mixer is coupled to the first input of the filter, and wherein the first output of the filter is looped back to the third input of the double mixer; and
   a buffer having an input and an output, the buffer operable to buffer and output at least an output signal, wherein the input of the buffer is coupled to the second output of the filter, wherein the filter is tunable to a predetermined frequency range by an adjustable reference voltage coupled to the buffer.

2. The integrated circuit of claim 1, wherein the level shift comprises a plurality of cascaded emitter followers.

3. The integrated circuit of claim 1, wherein the level shift comprises a plurality of diodes configured such the input signal is shifted down to a first shift signal and a second shift signal, respectively driving the first and second inputs of the double mixer.

4. The integrated circuit of claim 1, wherein the filter comprises a plurality of cascaded emitter followers.

5. The integrated circuit of claim 1, configured as a dynamic frequency divider that divides by N, where $N \geq 2$ and a positive integer.

6. A communication device comprising at least one radio-frequency integrated circuit, characterized by a dynamic frequency divider of claim 5.

7. A dynamic frequency divider by N, where $N \geq 2$ and a positive integer, comprising:
   a first divider input operable to receive a first input signal;
   level shift means comprising a first level-shift input and a plurality of level-shift outputs, wherein said first level-shift input is coupled to said first divider input;
   a double mixer comprising first and second double-mixer input and a first double-mixer output, wherein said first double-mixer input is coupled to a first level-shift output and wherein said second double-mixer input is coupled to said second level-shift output;
   filter means comprising a first filter-input and a plurality of filter outputs, wherein said first double-mixer output is coupled to said first filter input, and wherein a first filter output is looped back to a third double-mixer input;
   buffer means comprising a first buffer input and a first buffer output, operable to buffer and output at least a first output signal, wherein said first buffer input is coupled to a second filter output, wherein the filter means is tunable to a predetermined frequency range by an adjustable reference voltage of the buffer.

8. The dynamic frequency divider of claim 7, wherein the level shift means comprise a plurality of cascaded emitter followers.

9. The dynamic frequency divider of claim 7, wherein the level shift means comprise a plurality of diodes that are arranged such that the first input signal is shifted down to a first shift signal and a second shift signal, respectively driving said first and second double-mixer input.

10. The dynamic frequency divider of claim 7, wherein the filter means comprise a plurality of cascaded emitter followers.

11. The dynamic frequency divider of claim 7 further comprising a second divider input operable to receive a second input signal.

12. A method of dynamic frequency division comprising:
   level shifting a first input signal down to a first shift signal and a second shift signal;
   driving a first input of a double mixer with the first shift signal and driving a second input of the double mixer with the second shift signal;
   applying an output signal from the double mixer to a filter and looping a first output of the filter back to a third input of the double mixer;
   applying a second output of the filter to a buffer and providing an output signal at an output of the buffer; and
   tuning the filter to a predetermined frequency range by an adjustable reference voltage coupled to the buffer.

13. The method of claim 12, further comprising dividing the first input signal by 2.

14. The method of claim 12, further comprising dividing the first input signal by N, where $N \geq 2$ and a positive integer.

15. The method of claim 12, wherein the level shift comprises a plurality of cascaded emitter followers.

16. The method of claim 12, wherein the filter comprises a plurality of cascaded emitter followers.

17. The method of claim 12, further comprising level shifting a second input signal.

* * * * *